(12) United States Patent
Murakami et al.

(10) Patent No.: US 7,869,100 B2
(45) Date of Patent: Jan. 11, 2011

(54) IMAGE SENSOR, MODULE AND ELECTRONIC DEVICE

(75) Inventors: Takatoshi Murakami, Kyoto (JP); Nobuyuki Yamada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 787 days.

(21) Appl. No.: 11/853,332

(22) Filed: Sep. 11, 2007

(65) Prior Publication Data
US 2008/0061218 A1    Mar. 13, 2008

(30) Foreign Application Priority Data
Sep. 13, 2006   (JP)   .............................. 2006-248119

(51) Int. Cl.
*H04N 1/40* (2006.01)
(52) U.S. Cl. ........................ 358/471; 358/530; 358/425; 358/497; 358/509; 358/475; 382/274; 348/302; 348/308
(58) Field of Classification Search ................ 358/471, 358/497, 530, 425, 443, 446, 483, 482, 494, 358/509, 475, 514, 515, 516, 518; 382/274, 382/275; 348/302, 308, E5.091
See application file for complete search history.

(56) References Cited

U.S. PATENT DOCUMENTS

| 4,104,684 | A | * | 8/1978 | Wakami et al. ................ 360/70 |
| 4,992,755 | A | * | 2/1991 | Seevinck et al. ............. 330/253 |
| 5,122,644 | A | * | 6/1992 | Hasegawa et al. ....... 235/462.26 |
| 2002/0080406 | A1 | * | 6/2002 | Kulhalli et al. .................. 358/3 |
| 2003/0227561 | A1 | * | 12/2003 | Sakata et al. ................. 348/335 |
| 2004/0262492 | A1 | * | 12/2004 | Matsuda et al. ........... 250/208.1 |

FOREIGN PATENT DOCUMENTS

| CN | 1044554 | 8/1990 |
| JP | 05-048844 | 2/1993 |
| WO | WO 2005/071942 | 8/2005 |

\* cited by examiner

*Primary Examiner*—Negussie Worku
(74) *Attorney, Agent, or Firm*—Fish & Richardson P.C.

(57) ABSTRACT

From an amplifier circuit of a plurality of pixels each, a signal is directly output to a signal line. Even if the signal line is longer and the signal line has an increased parasitic capacitance, attenuation of the signal transmitted through the signal line can be prevented. Therefore, the dynamic range of the signal output can be expanded and the information can be output accurately.

16 Claims, 9 Drawing Sheets

IMAGE SENSOR, MODULE AND ELECTRONIC DEVICE

BACKGROUND OF THE INVENTION

1. Field of the Invention

The present invention relates to an image sensor, a module and an electronic device including the module. In particular, the invention relates to a linear image sensor used for document reading and for image input for example, a module including a plurality of linear image sensors and an electronic device including the module.

2. Description of the Background Art

A common CMOS (Complementary Metal Oxide Semiconductor) image sensor includes a plurality of photoelectric conversion elements (such as photodiodes for example) for converting an optical signal into an electric signal and a plurality of amplifier circuits provided correspondingly to a plurality of photoelectric conversion elements respectively. The amplifier circuit is configured for example with a source-follower circuit including a MOS transistor.

In the image sensor having the above-described configuration, regardless of whether or not light is incident on the image sensor, an offset signal at a certain voltage level could be output from the source-follower circuit. Further, respective magnitudes of offset signals of a plurality of source-follower circuits could be different from each other. The reason why respective magnitudes of offset signals are different from each other is that characteristics of the MOS transistors could be different from each other due to a factor such as a manufacturing process.

If the above-described phenomenon occurs, respective reference levels of image signals that are output from respective pixels are different from each other. In this case, even if an image is reproduced based on image signals that are output from the image sensor, the original image read by the image sensor could not be reproduced with precision.

For example, Japanese Patent Laying-Open No. 05-048844 discloses an image sensor in which differences in characteristics between source-follower circuits can be reduced. In this image sensor, a voltage that is output from the source-follower circuit immediately after the photoelectric conversion element is reset is held in a capacitor first. Then, as the photoelectric conversion element receives light, the output voltage of the photoelectric conversion element (namely the input voltage to the source-follower circuit) changes. Accordingly, as the output voltage of the source-follower circuit changes, only the voltage corresponding to a change of the output voltage of the source-follower circuit is output from one end of the capacitor. Thus, from one end of the capacitor, an image signal from which an offset component is removed can be taken.

The image sensor disclosed in Japanese Patent Laying-Open No. 05-048844 uses a system in which the capacitor is charged with a signal voltage from the photodiode and the charge of the capacitor is used to convey a signal to the outside. Therefore, a line connecting one end of the capacitor and an output circuit is long. In this case, a parasitic capacitance due to the length of the line is also large. Supposing that the capacitance of the capacitor is C1 and the parasitic capacitance of the line is C2, the voltage of the image signal that is output from the other end of the capacitor decreases to a voltage which is C1/(C1+C2) times as large as the original voltage. In other words, a problem of signal attenuation occurs.

Japanese Patent Laying-Open No. 05-048844 discloses an output circuit for solving this problem. However, the other end of the capacitor is connected by a common line to the output circuit. Therefore, the problem of the signal attenuation due to the long line has not been solved.

SUMMARY OF THE INVENTION

An object of the present invention is to provide an image sensor, a module including the image sensor and an electronic device including the module, with which the dynamic range of signal output can be expanded and information can be output accurately.

In summary, the present invention is an image sensor including a plurality of pixels that are selectively activated. The plurality of pixels each include: a photoelectric conversion element outputting a first signal according to a received light intensity; a reset circuit outputting a reference voltage; and an amplifier circuit amplifying the first signal to output a second signal and outputting a third signal in a case where the amplifier circuit receives the reference voltage instead of the first signal. The image sensor further includes a correction circuit. The correction circuit holds a voltage value of one of the second signal and the third signal, uses a voltage value of the other of the second signal and the third signal as well as the held voltage value, and removes from the second signal an offset voltage that could be output from the amplifier circuit.

Preferably, the image sensor further includes a signal line receiving the second signal and the third signal from the amplifier circuit and transmitting the second signal and the third signal to the correction circuit.

Preferably, the plurality of pixels each further include a first switch provided between an output terminal of the amplifier circuit and a first node. The correction circuit includes: a capacitor having one end with a fixed voltage and the other end receiving the second signal which is input thereto, and holding the voltage value of the second signal; a second switch provided between the first node and the other end of the capacitor, turned on in a period in which the second signal is input and turned off in a period in which the third signal is input; and a differential circuit calculating a difference between a voltage value of the first node and a voltage value of the other end of the capacitor.

More preferably, the correction circuit further includes: a first output buffer for outputting a voltage held by the capacitor to the differential circuit; and a second output buffer for outputting a voltage of the first node to the differential circuit.

More preferably, the reset circuit includes a third switch. The third switch is provided between a reference voltage terminal to which the reference voltage is supplied and a signal output terminal from which the first signal is output by the photoelectric conversion element. The image sensor further includes a switch control circuit successively selecting the plurality of pixels based on an input clock signal and controlling the first switch and the third switch included in a selected pixel and controlling the second switch included in the correction circuit. The switch control circuit turns on the first switch for one period of the clock signal, turns on and off the second switch in one period of the clock signal, and turns on the third switch in a period in which the second switch is turned off.

Still preferably, the switch control circuit turns on the third switch after the second switch is turned off.

Still preferably, the switch control circuit provides to the second switch a first control signal that changes in synchronization with the clock signal to operate the second switch, and provides to the third switch a second control signal that is a delayed version of the clock signal to operate the third switch.

Preferably, the plurality of pixels each further include a first switch provided between an output terminal of the amplifier circuit and a first node. The correction circuit includes: a capacitor having one end coupled to the first node; a constant voltage source outputting a predetermined voltage from a voltage output terminal; and a second switch provided between the voltage output terminal and the other end of the capacitor.

More preferably, the correction circuit further includes an output buffer for outputting a voltage of the other end of the capacitor.

More preferably, the reset circuit includes a third switch. The third switch is provided between a reference voltage terminal to which the reference voltage is supplied and a signal output terminal from which the first signal is output by the photoelectric conversion element. The image sensor further includes a switch control circuit successively selecting the plurality of pixels based on an input clock signal and controlling the first switch and the third switch included in a selected pixel and controlling the second switch included in the correction circuit. The switch control circuit turns on the first switch for one period of the clock signal, turns on and off the second switch in one period of the clock signal, and turns on the third switch in a period in which the second switch is turned off.

Still preferably, the switch control circuit turns on the third switch after the second switch is turned off.

Still preferably, the switch control circuit provides to the second switch a first control signal that changes in synchronization with the clock signal to operate the second switch, and provides to the third switch a second control signal that is a delayed version of the clock signal to operate the third switch.

According to another aspect of the present invention, a module includes at least one image sensor. The image sensor includes a plurality of pixels that are selectively activated. The plurality of pixels each include: a photoelectric conversion element outputting a first signal according to a received light intensity; a reset circuit outputting a reference voltage; and an amplifier circuit amplifying the first signal to output a second signal and outputting a third signal in a case where the amplifier circuit receives the reference voltage instead of the first signal. The image sensor further includes a correction circuit. The correction circuit holds a voltage value of one of the second signal and the third signal, uses a voltage value of the other of the second signal and the third signal as well as the held voltage value, and removes from the second signal an offset voltage that could be output from the amplifier circuit.

According to still another aspect of the present invention, an electronic device includes a module including at least one image sensor. At least one image sensor includes a plurality of pixels that are selectively activated. The plurality of pixels each include: a photoelectric conversion element outputting a first signal according to a received light intensity; a reset circuit outputting a reference voltage; and an amplifier circuit amplifying the first signal to output a second signal and outputting a third signal in a case where the amplifier circuit receives the reference voltage instead of the first signal. At least one image sensor further includes a correction circuit. The correction circuit holds a voltage value of one of the second signal and the third signal, uses a voltage value of the other of the second signal and the third signal as well as the held voltage value, and removes from the second signal an offset voltage that could be output from the amplifier circuit.

Preferably, at least one image sensor is a plurality of image sensors. The electronic device further includes a power supply control circuit. The power supply control circuit successively selects the plurality of image sensors, supplies power to the amplifier circuit included in a selected image sensor and stops power supply to the amplifier circuit included in at least one other image sensor.

More preferably, the plurality of pixels each further include a switch unit making a switch between a state of supplying power to the amplifier circuit and a state of supplying no power to the amplifier circuit, according to instruction of the power supply control circuit.

As seen from the above, main features of the present invention are that the dynamic range of signal output of the image sensor can be expanded and information can be output accurately from the image sensor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described in detail with reference to the drawings. In the drawings, like or corresponding components are denoted by like reference characters, and a description thereof will not be repeated.

First Embodiment

Figure 1:
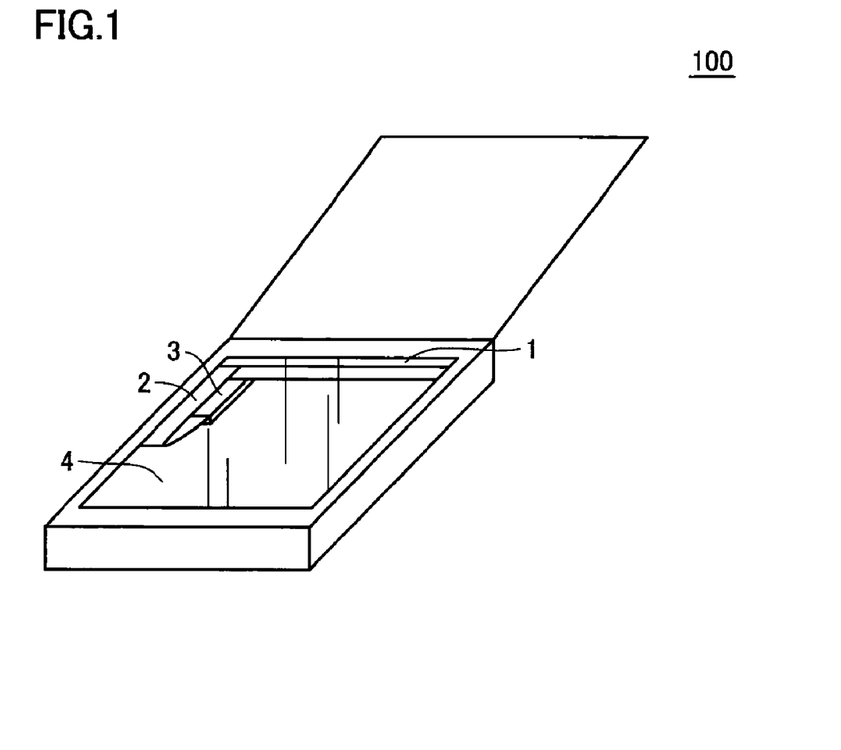
FIG. 1 is a diagram showing an example of an electronic device on which mounted an image sensor according to an embodiment.

FIG. 1 is a diagram showing an example of an electronic device on which mounted an image sensor according to the present embodiment.

Referring to FIG. 1, a scanner 100 is an example of the electronic device on which an image sensor of the present embodiment is mounted. Scanner 100 includes an image sensor head 1, a flexible cable 2, a control unit 3 connected through flexible cable 2 to image sensor head 1, and a document reading platform 4 on which an original document where characters and image are indicated is to be placed.

Image sensor head 1 corresponds to the module of the present invention. Image sensor head 1 is movable, and reads characters and images from the document placed on document reading platform 4 and transmits an image signal to control unit 3.

Control unit 3 reproduces the image read by image sensor head 1 based on the image signal. Control unit 3 controls operation of image sensor head 1.

The electronic device on which the image sensor of the present embodiment is mounted is not limited to the scanner. For example, the image sensor of the present embodiment may also be used for devices such as facsimile, copying machine and all-in-one printer (a printer having the functions of facsimile and scanner for example in addition to the printer function).

Figure 2:
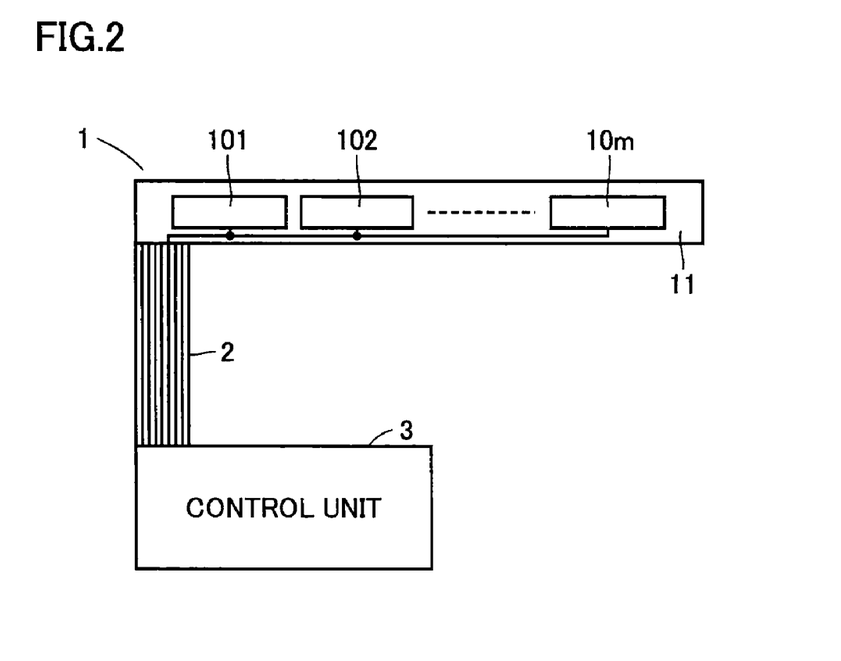
FIG. 2 is a diagram showing an exemplary configuration of an image sensor head 1 in FIG. 1.

FIG. 2 is a diagram showing an exemplary configuration of image sensor head 1 in FIG. 1. Referring to FIG. 2, image sensor head 1 includes m (m is an integer of at least two) image sensors 101 to 10m arranged in a one-dimensional manner. Image sensors 101 to 10m are mounted on a circuit substrate 11. Circuit substrate 11 and control unit 3 are connected through flexible cable 2. Thus, an image signal that is output from image sensors 101 to 10m is transmitted to control unit 3 and a control signal that is output from control unit 3 is transmitted to image sensors 101 to 10m.

A configuration of image sensors 101 to 10m will be described now. Since image sensors 101 to 10m have respective configurations similar to each other, the configuration of image sensor 101 will be described in the following as a representative one.

Figure 3:
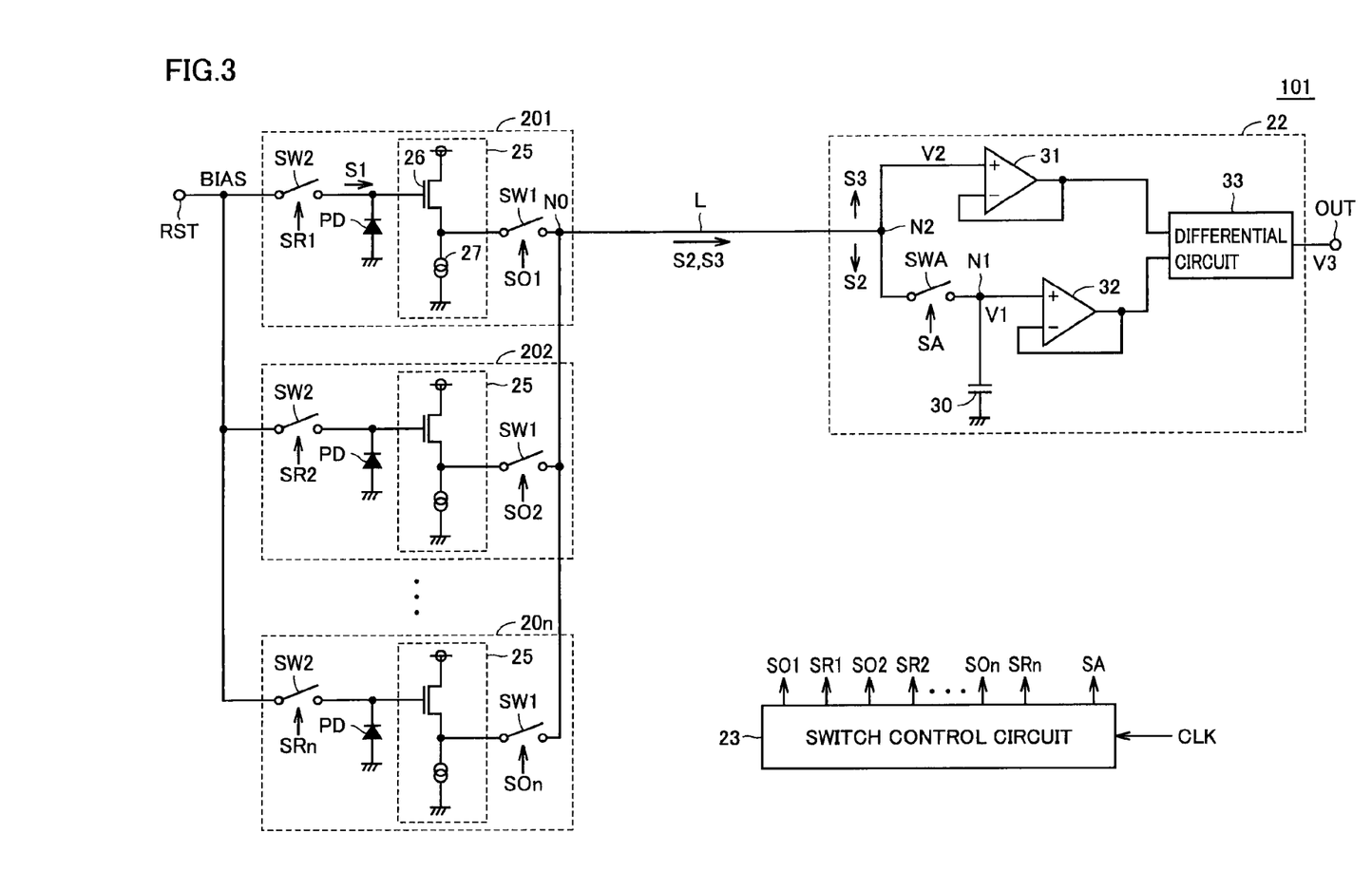
FIG. 3 is a diagram showing a configuration of image sensor 101.

FIG. 3 shows the configuration of image sensor 101.

Referring to FIG. 3, image sensor 101 includes n (n is an integer of at least two) pixels 201 to 20n arranged in a one-dimensional manner, a signal line L, a correction circuit 22 and a switch control circuit 23.

Since pixels 201 to 20n have respective configurations identical to each other, the configuration of pixel 201 will be described in the following as a representative one. Pixel 201 includes a photodiode PD which is a photoelectric conversion element, an amplifier circuit 25 and switches SW1, SW2.

Photodiode PD has its cathode terminal and its anode terminal connected respectively to an input terminal of amplifier circuit 25 and a ground node. Receiving light, photodiode PD outputs signal S1 from the cathode terminal.

Amplifier circuit 25 is a source-follower circuit. Specifically, amplifier circuit 25 includes an N-channel MOS transistor 26 and a constant-current circuit 27. The gate of N-channel MOS transistor 26 corresponds to the input terminal of amplifier circuit 25. The drain of N-channel MOS transistor 26 is connected to a power supply node. Constant-current circuit 27 flows constant current from the source of N-channel MOS transistor 26 toward the ground node. Constant-current circuit 27 is configured for example with a current mirror circuit.

The source of N-channel MOS transistor 26 corresponds to the output terminal of amplifier circuit 25. Switch SW1 is connected between the source of N-channel MOS transistor 26 and a node N0 and is turned on and off according to signal SO1.

The source-follower circuit may be configured to include a P-channel MOS transistor instead of the N-channel MOS transistor. In this case, the source-follower circuit is configured for example in the following manner. The source of the P-channel MOS transistor is connected to one end of switch SW1, the drain of the P-channel MOS transistor is connected to the ground node and the gate of the P-channel MOS transistor is connected to the cathode terminal of photodiode PD. Constant-current circuit 27 is connected between the power supply node and the source of the P-channel MOS transistor.

Switch SW2 is connected between a terminal RST (reference voltage terminal) to which voltage BIAS (reference voltage) is applied and the cathode terminal (signal output terminal) of photodiode PD. Switch SW2 is turned on and off according to signal SR1.

When switch SW2 is turned on, voltage BIAS which is a bias voltage in the reverse direction is applied to photodiode PD and accordingly, a junction capacitor of photodiode PD is charged. On the contrary, when switch SW2 is turned off and photodiode PD receives light, the junction capacitor of photodiode PD gradually discharges according to the photocurrent. Accordingly, the cathode voltage of photodiode PD becomes lower than voltage BIAS by a voltage according to the amount of incident light. Signal S1 represents a voltage by which the cathode voltage of photodiode PD changes.

Signal S1 is supplied to the input terminal of amplifier circuit 25 and amplified by amplifier circuit 25. When switch SW1 is turned on, signal S2 is output from amplifier circuit 25 to node N0. On the contrary, when switch SW2 is turned on, signal S1 is reset. In other words, voltage BIAS (reference voltage) is input to amplifier circuit 25 instead of signal S1. At this time, if switch SW1 is turned on, signal S3 is output to node N0.

Respective operations of pixels 202 to 20n are similar to the operation of pixel 201. Pixels 202 to 20n receive signals SO2 to SOn for controlling switch SW1 and receive signals SR2 to SRn for controlling switch SW2.

Signal line L is commonly provided to pixels 201 to 20n. Signal line L is connected between node N0 and node N2 and transmits signals S2, S3.

Correction circuit 22 includes a capacitor 30, buffers (buffer amplifiers) 31, 32, a switch SWA and a differential circuit 33.

Capacitor 30 is commonly provided to pixels 201 to 20n. One end of capacitor 30 is grounded and the voltage is fixed. The other end of capacitor 30 is connected to node N1.

Buffer 31 has its input terminal connected to node N2. Buffer 32 has its input terminal connected to node N1. Buffers 31, 32 are so-called voltage-follower circuit. Therefore, for these buffers, the input voltage and the output voltage are equal to each other.

Switch SWA is connected between node N1 and node N2 and is turned on and off according to signal SA. If switch SWA is turned on in a period in which signal S2 is output from amplifier circuit 25, signal S2 is input to the other end (the terminal connected to node N1) of capacitor 30.

Accordingly, the voltage on node N1 is equal to the voltage of signal S2. After this, while signal S3 is output from amplifier circuit 25, switch SWA is turned off. In this period, the voltage on node N1 is kept at the voltage value of signal S2.

Differential circuit 33 outputs from a terminal OUT voltage V3 corresponding to a difference between the output voltage of buffer 31 and the output voltage of buffer 32 (namely the difference between voltage V1 on node N1 and voltage V2 on node N2).

Regardless of whether or not light is incident on photodiode PD, an offset voltage could be output from N-channel MOS transistor 26 included in amplifier circuit 25. It is supposed here that this offset voltage is α. Signal S2 and signal S3 include an offset component (offset voltage α). In the case where respective characteristics of the MOS transistors included in respective pixels are different from each other, respective pixels have different values of offset voltage α.

In contrast, voltage V3(=V2−V1) that is output from differential circuit 33 does not include offset voltage α. Therefore, it is unnecessary to consider the offset voltage of the N-channel MOS transistor in the present embodiment. Thus, in the present embodiment, an image signal according to an amount of received light can be taken from each pixel. In other words, the present embodiment can improve the reading accuracy of the image sensor.

Switch control circuit 23 controls switches SW1, SW2 included in each pixel and switch SWA included in correction circuit 22. Switch control circuit 23 receives clock signal CLK and outputs signals SO1 to SOn, SR1 to SRn and SA. Clock signal CLK may be directly input to switch control circuit 23 from the outside of image sensor 101, or may be generated in image sensor 101 based on a clock signal that is input from the outside.

Figure 4:
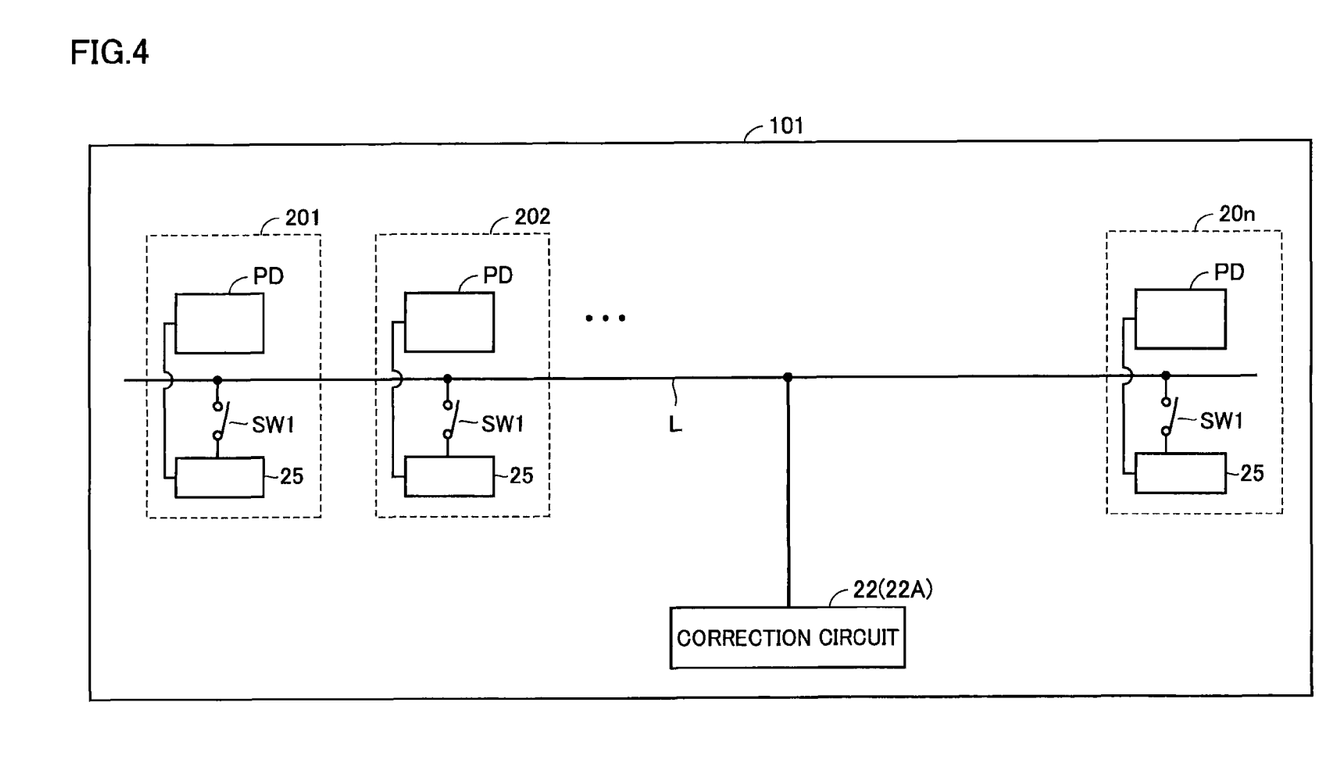
FIG. 4 is a diagram illustrating arrangement of pixels 201 to 20n and a signal line L shown in FIG. 3.

FIG. 4 illustrates arrangement of pixels 201 to 20n and signal line L shown in FIG. 3.

Referring to FIG. 4, pixels 201 to 20n are arranged in a predetermined direction. The direction in which signal line L extends is the same as the direction in which the pixels are arranged. Therefore, if the number of pixels is larger, signal line L will be longer. In pixels 201 to 20n each, photodiode PD and amplifier circuit 25 are arranged with signal line L therebetween. Amplifier circuit 25 and signal line L are connected by switch SW1. Correction circuit 22 is not directly connected to signal line L and connected to signal line L by another signal line.

A feature of the configuration of the image sensor of the present embodiment will be described.

Figure 5:
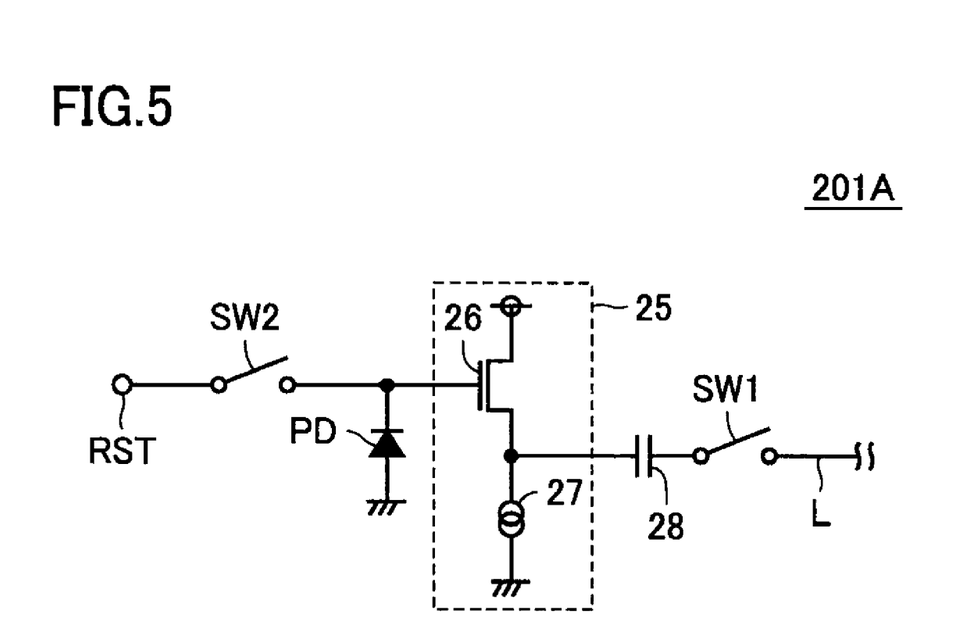
FIG. 5 is a diagram illustrating a configuration of a pixel in a comparative example of the present embodiment.

FIG. 5 is a diagram illustrating a configuration of a pixel in a comparative example of the present embodiment.

Referring to FIGS. 5 and 3, pixel 201A differs from pixel 201 in that the former additionally includes a capacitor 28 connected between one end of switch SW1 and N-channel MOS transistor 26. The configuration of pixel 201A concerning other components of the pixel are similar to that concerning corresponding components of pixel 201.

Capacitor 28 is provided in the vicinity of amplifier circuit 25. If the signal line connecting capacitor 28 and the output circuit is longer, a signal transmitted through the signal line could be attenuated due to influences of the parasitic capacitance of the signal line.

In pixel 201A, the signal voltage that is output from amplifier circuit 25 causes electric charge to be stored in capacitor 28. The electric charge stored in capacitor 28 is used to transmit a signal by signal line L. If signal line L is disposed along the pixels as shown in FIG. 4, signal line L is longer as the number of pixels is larger. As signal line L is longer, the parasitic capacitance of signal line L is larger. Here, it is supposed that the capacitance of capacitor 28 is C1 and the parasitic capacitance of signal line L is C2. Then, the voltage of the signal that is output from the other end of capacitor 28 decreases to the one which is $C1/(C1+C2)$ times as high as the original voltage. In other words, as the parasitic capacitance is larger (signal line L is longer), the voltage from the other end of capacitor 28 is smaller.

In order to prevent this problem, the capacitance of capacitor 28 may be increased. In this case, however, the area of capacitor 28 becomes larger. This means that, as the number of pixels is larger, the area of a semiconductor chip where the image sensor is formed has to be made larger.

In contrast, in the present embodiment as shown in FIG. 3, amplifier circuit 25 (source-follower circuit) itself outputs a signal to signal line L. In this case, the parasitic capacitor of signal line L can be charged by the power supply node. Therefore, a considerable attenuation of the signal voltage can be prevented.

Further, since switch SWA is provided, a decrease of voltage V1 due to the parasitic capacitance of signal line L can be made as small as possible if voltage V1 is output from capacitor 30 to buffer 32 while switch SWA is tuned off. Therefore, the image sensor can be implemented with which the dynamic range of signal output can be expanded and information can be output accurately.

Since none of a plurality of pixels 201 to 20n of the present embodiment includes a capacitor, the area of image sensor 101, namely the area of the semiconductor chip can be reduced. Correction circuit 22 may include n capacitors for holding the voltage of signal S2 that is output from pixels 201 to 20n each.

Figure 6:
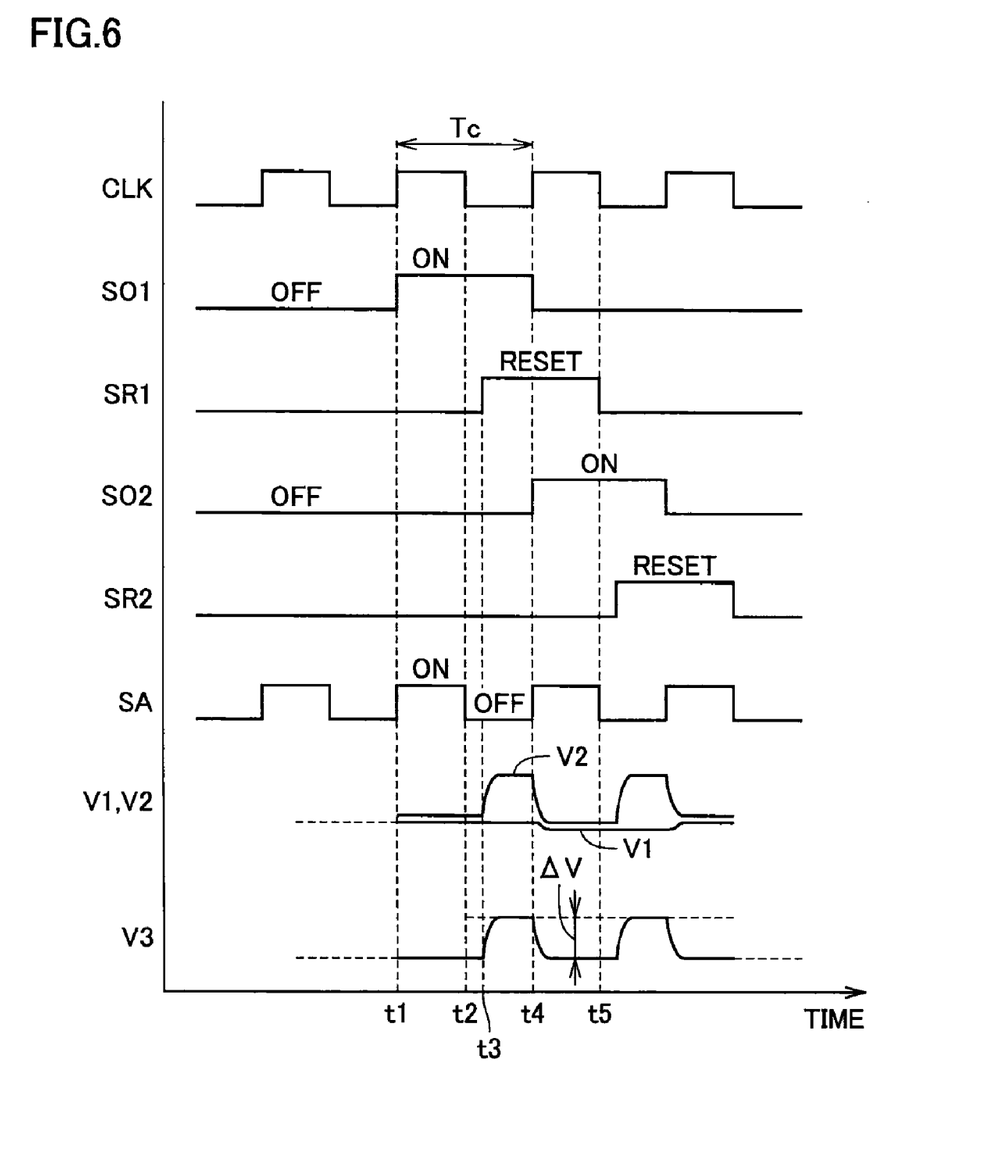
FIG. 6 is a signal waveform chart illustrating operation of image sensor 101 shown in FIG. 3.

FIG. 6 is a signal waveform chart illustrating operation of image sensor 101 shown in FIG. 3. In the following description, it is supposed that pixels 201 to 20n receive the same amount of light.

Referring to FIGS. 6 and 3, until time t1, pixels 201 to 20n each receive light. Accordingly, the electric charge stored in the junction capacitor of photodiode PD included in each pixel is discharged.

At time t1, clock signal CLK rises. In response to this, signal SO1 and signal SA rise. Switch SW1 of pixel 201 changes from the off state to the on state and switch SWA changes from the off state to the on state.

Signal S1 is input to amplifier circuit 25 of pixel 201. Then, amplifier circuit 25 outputs signal S2. Receiving signal S2, capacitor 30 holds the voltage of the signal. When both of switches SW1 and SWA are turned on, voltage V1 and voltage V2 are equal to each other. It is noted, however, for the purpose of distinguishing voltages V1 and V2 from each other, FIG. 6 shows voltage V2 and voltage V1 as different ones.

Next, at time t2, clock signal CLK falls and signal SA falls. Accordingly, switch SWA changes from the on state to the off state. Thus, the magnitude of voltage V1 is kept at the magnitude before switch SWA is turned off.

After switch SWA is turned off, signal SR1 rises at time t3. Accordingly, switch SW2 is turned on and signal S1 is reset. At this time, amplifier circuit 25 outputs signal S3. Thus, voltage V2 is equal to the voltage of signal S3.

If switch SW2 is turned on while switch SWA is kept on, voltage V1 and voltage V2 are equal to each other and capacitor 30 cannot hold the voltage of signal S2. Therefore, switch control circuit 23 turns off switch SWA and thereafter turns on switch SW2. Thus, the voltage of signal S2 can be held by capacitor 30.

Switch control circuit 23 changes signal SA in synchronization with clock signal CLK and delays clock signal CLK to output signal SR1. Thus, after switch SWA is turned off, switch SW2 can be turned on. For delaying clock signal CLK, a delay circuit (a delay circuit with inverters in multiple stages for example) is provided in switch control circuit 23 for example. As the length of the line connecting switch control circuit 23 and switch SW2 is longer, signals SR1 to SRn transmitted through the line delay to a greater degree. Therefore, the line connecting switch control circuit 23 and switch SW2 may be set to a predetermined length, so that transmission of signal SR1 from switch control circuit 23 to switch SW2 may be delayed.

In the period from time t3 to time t4, voltage V3 changes since voltage V1 and voltage V2 that are input to differential circuit 33 are different from each other.

Clock signal CLK rises at time t4, and signal SO1 falls and signal SO2 and signal SA rise. At time t5, clock signal CLK falls, and signal SR1 falls and signal SA falls. After time t4, signals SO2, SR2, SA change similarly to signals SO1, SR1, SA that change in the period from time t1 to time t4. The change of voltages V1, V2, V3 after time t4 is similar to the change of voltages V1, V2, V3 in the period from time t1 to time t4.

Voltage V1 in the period from time t1 to time t2 is different from voltage V1 in the period from time t4 to time t5. This is applied as well to voltage V2. This is for the reason that respective characteristics of N-channel MOS transistors included in pixels 201 and 202 are different from each other and accordingly respective magnitudes of offset voltage α are different between pixel 201 and pixel 202.

However, voltage V3 does not include offset voltage α as described above. Further, pixel 201 and pixel 202 receive the same amount of light. Therefore, a change ΔV of voltage V3 of pixel 201 is identical to that of pixel 202.

It is supposed here that the period of clock signal CLK is Tc. Signal SA changes in synchronization with clock signal CLK. Therefore, switch SWA changes between the on state and the off state for every period of ½×Tc.

Specifically, switch control circuit 23 successively selects a plurality of pixels and turns on switch SW1 included in a selected pixel for one period of clock signal CLK. Switch control circuit 23 turns on and off switch SW2 in one period of clock signal CLK. Further switch control circuit 23 turns on switch SWA in a period in which switch SW2 is turned off. As seen from the above, the signal is output from each pixel in one period of clock signal CLK, so that information (image signal) can be read speedily from the image sensor.

In accordance with the first embodiment as described above, the amplifier circuit of each pixel outputs a signal voltage directly to the signal line provided commonly to the pixels. Therefore, even if the signal line is long, attenuation of the signal transmitted through the signal line can be prevented. Thus, in accordance with the first embodiment, the dynamic range of the signal output can be expanded and information can be output accurately.

Further, in accordance with the first embodiment, the capacitor is provided commonly to a plurality of pixels. Therefore, the chip area can be reduced.

Second Embodiment

Regarding an image sensor of a second embodiment, the configuration of the correction circuit can be simplified as compared with the image sensor of the first embodiment.

Figure 7:
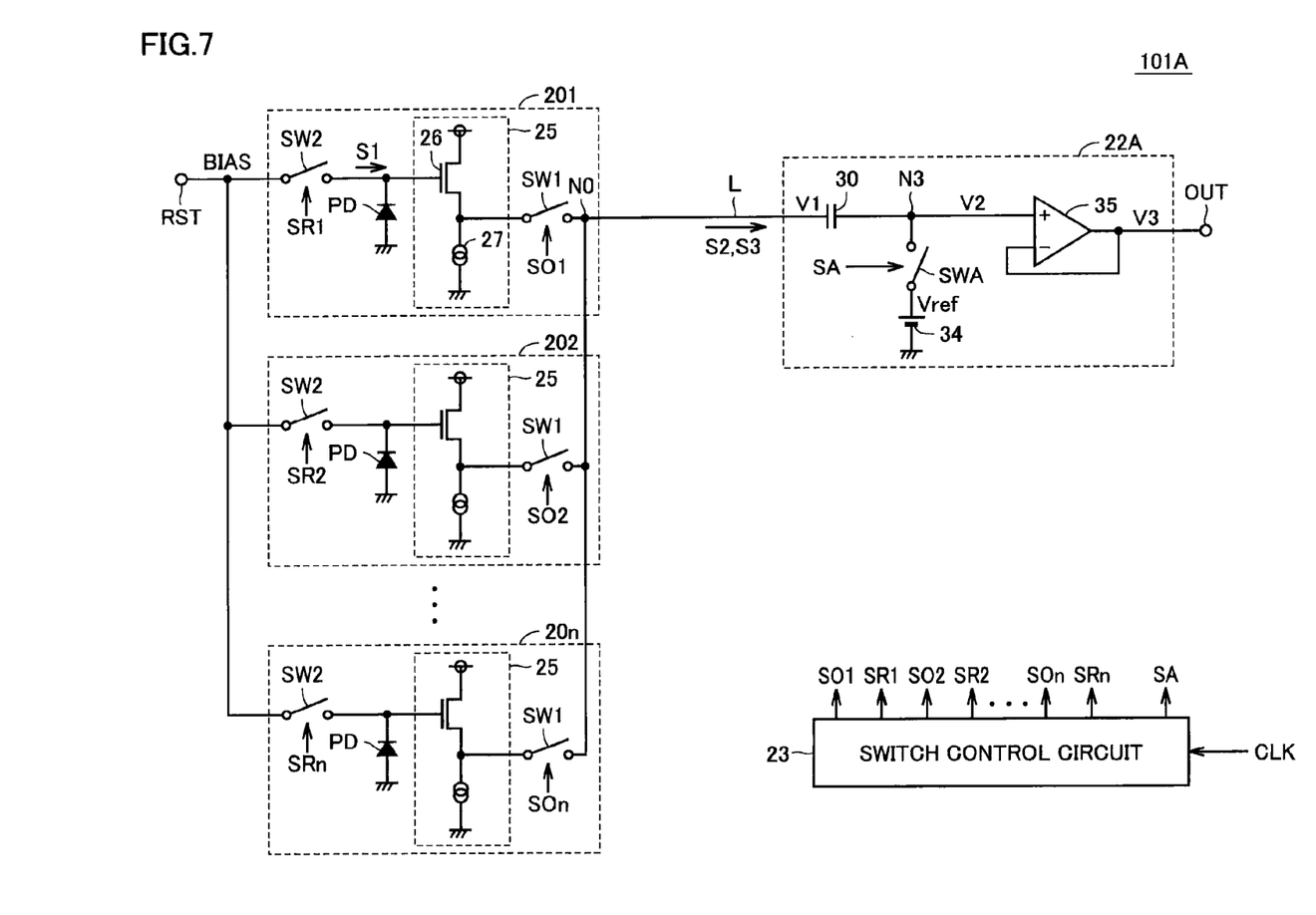
FIG. 7 is a diagram showing a configuration of an image sensor in a second embodiment.

FIG. 7 is a diagram showing a configuration of an image sensor of the second embodiment.

Referring to FIGS. 7 and 3, image sensor 101A differs from image sensor 101 in that the former sensor includes a correction circuit 22A instead of correction circuit 22.

Correction circuit 22A includes a capacitor 30, a switch SWA, a constant voltage source 34 and a buffer 35. One end of capacitor 30 is connected to a node N0 and the other end of the capacitor is connected to a node N3. One end of switch SWA is connected to node N3 and the other end of switch SWA is connected to a voltage output terminal of constant voltage source 34. The input terminal of buffer 35 is connected to node N3 and the output terminal of buffer 35 is connected to terminal OUT.

As seen from a comparison between correction circuit 22A and correction circuit 22, correction circuit 22A does not include the differential circuit. The number of buffers included in correction circuit 22A is smaller than the number of buffers included in correction circuit 22. Therefore, the second embodiment can provide a reduced circuit scale as compared with the first embodiment.

Operation of the image sensor of the second embodiment will be described. It is supposed that the voltage on one end (terminal connected to node N0) of capacitor 30 is V1, the voltage on the other end (terminal connected to node N3) of capacitor 30 is V2 and the voltage on terminal OUT is V3. Here, buffer 35 is a voltage-follower circuit and voltage V2 and voltage V3 are equal to each other.

Figure 8:
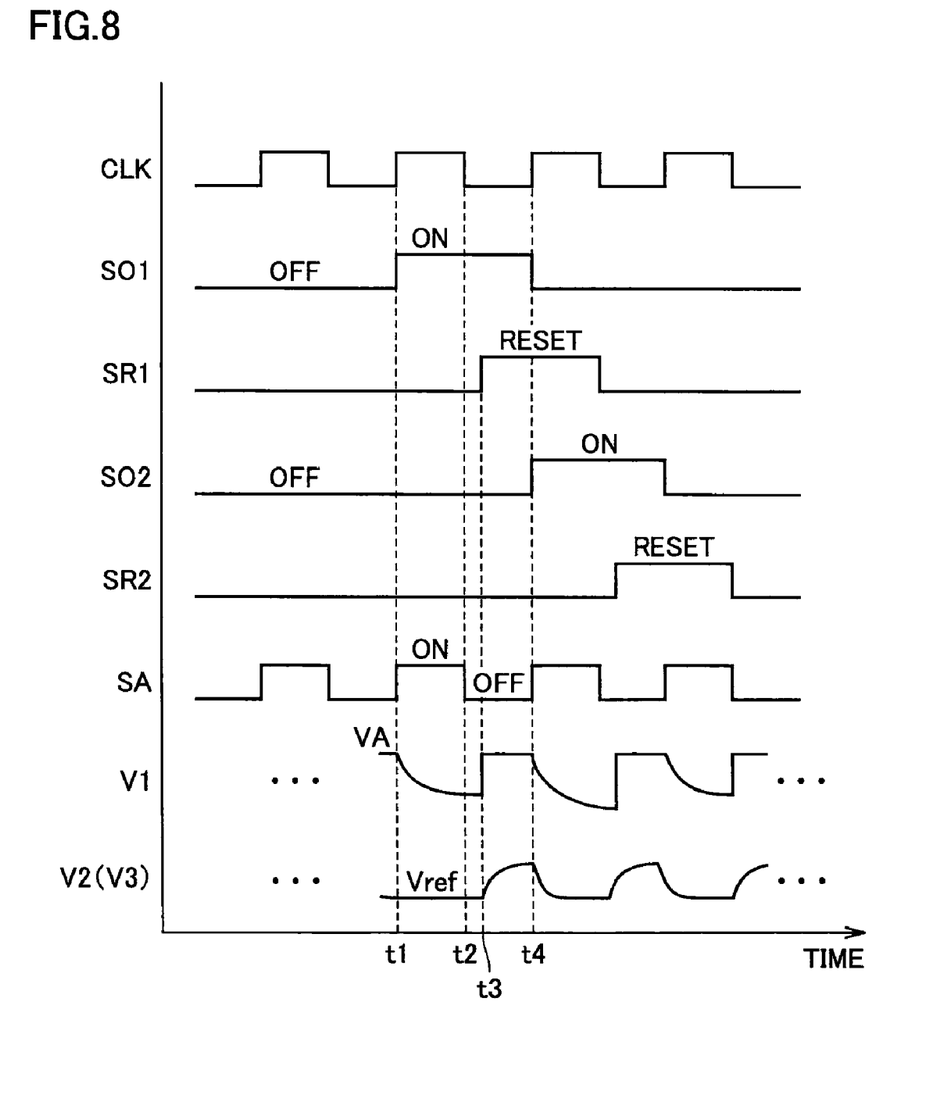
FIG. 8 is a signal waveform chart illustrating operation of image sensor 101A in FIG. 7.

FIG. 8 is a signal waveform chart illustrating operation of image sensor 101A in FIG. 7.

Referring to FIGS. 8 and 6, the change of signals SO1, SR1, SO2, SR2, SA with respect to clock signal CLK in the second embodiment is similar to that of the first embodiment. Therefore, in the following, the change of voltages V1 to V3 of the second embodiment will be described.

Referring to FIGS. 8 and 7, at time t1, signal SA rises and switch SWA is turned on. Accordingly, voltage V2 (V3) becomes equal to the output voltage of constant voltage source 34, namely equal to voltage Vref.

Until time t1, voltage V1 is equal to voltage VA which is the voltage of signal S3. At time t1, signal S2 is output from amplifier circuit 25 and voltage V1 decreases. As a result, the voltage between the two terminals of capacitor 30 becomes equal to (V1−Vref).

Then, at time t2, signal SA falls and switch SWA is turned off. Subsequently, at time t3, signal SR1 rises and signal S1 is reset. Accordingly, signal S3 is output from amplifier 25 of pixel 201. Thus, voltage V1 reaches voltage VA. The voltage between the two terminals of capacitor 30 is kept at (V1−Vref) and therefore, voltage V2 is {VA−(V1−Vref)}.

Voltages VA and V1 include offset voltage α of N-channel MOS transistor 26. However, voltage V2 includes a difference between voltage VA and voltage V1. Therefore, voltage V2 does not include offset voltage α.

As described above, according to the second embodiment, the circuit configuration can further be simplified as compared with the first embodiment.

In the image sensors of the first and second embodiments, the capacitor is provided commonly to the pixels. If a plurality of capacitors are provided correspondingly to a plurality of pixels respectively, the output voltage from a pixel can be held in each capacitor. In contrast, the first and second embodiments provide a capacitor commonly to the pixels. Therefore, respective output voltages from respective pixels have to be held successively in the capacitor and the time consumed for storing electric charge has to be considered. Accordingly, the time for measuring the voltage of the capacitor could be shortened.

As described above, the image sensor of the present embodiment outputs a difference between signal S2 and signal S3 in one period of the clock signal. Therefore, signal S2 and signal S3 have to be risen immediately. In order to allow the signals to rise quickly, the current flowing through constant current circuit 27 included in amplifier circuit 25 shown in FIG. 3 (and FIG. 7) has to be increased.

However, if the current flowing through the constant current circuit is increased, the power consumption of image sensor head 1 (module) shown in FIG. 2 increases. In order to prevent this problem, control unit 3 shown in FIG. 2 provides the power supply to only the amplifier circuit included in the image sensor to be operated, and stops the power supply to respective amplifier circuits included in other image sensors. In this way, the power consumption of the image sensor head can be prevented from increasing.

Figure 9:
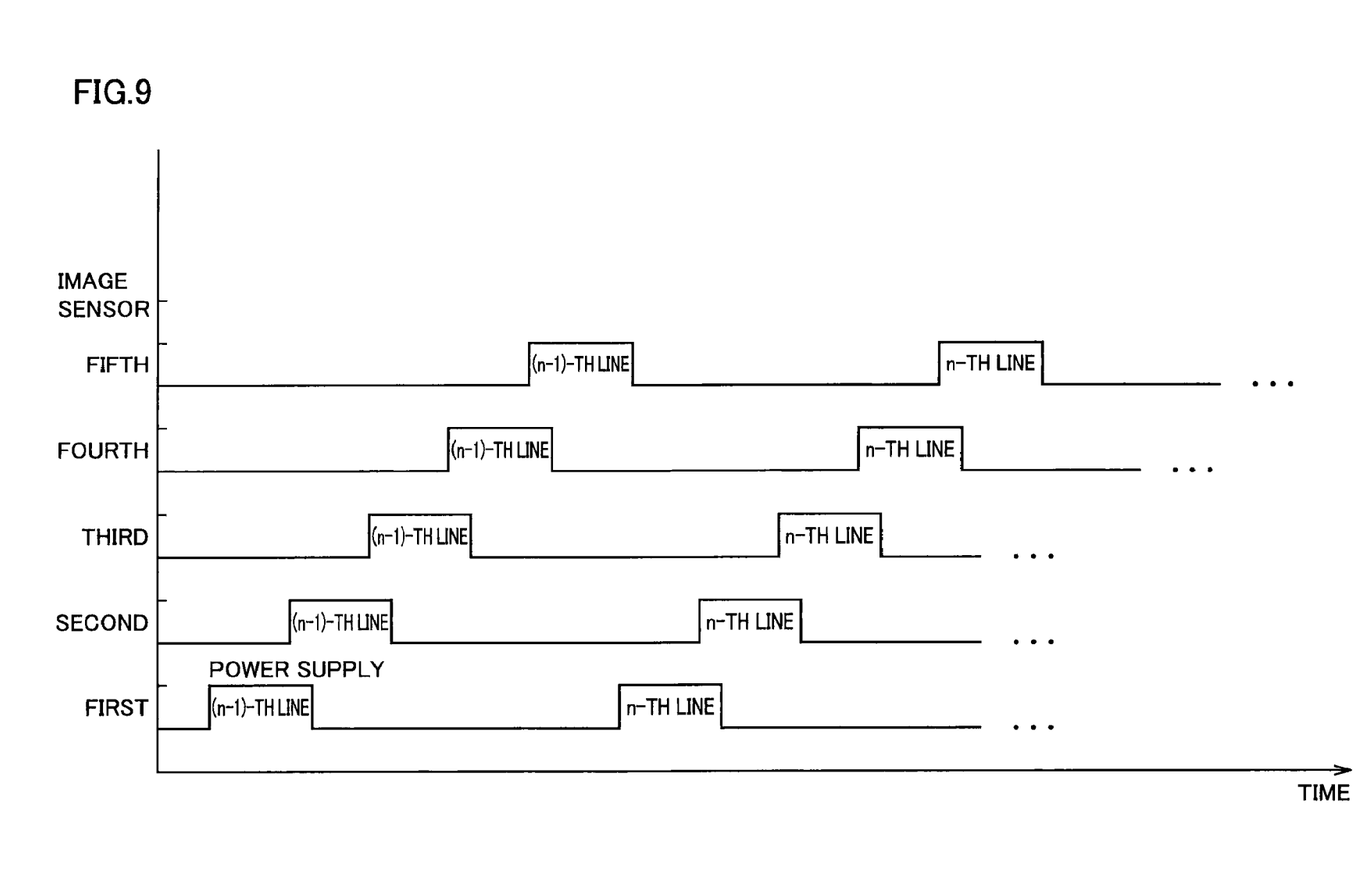
FIG. 9 is a diagram schematically illustrating control of power supply performed on the image sensor by a control unit 3 shown in FIG. 2.

FIG. 9 schematically illustrates control of power supply to the image sensor by control circuit 3 shown in FIG. 2. In the following description, it is supposed that image sensor head 1 includes five image sensors.

In FIG. 9, the five signals show the state where control unit 3 shown in FIG. 2 supplies power to the first to five image sensors. The signal for the first image sensor will be described as a representative one. In the period of time in which the signal is has H level, power is supplied to the amplifier circuit of the first image sensor. In the period of time in which the signal has L level, the power supply to the amplifier circuit of the first image sensor is stopped.

Figure 10:
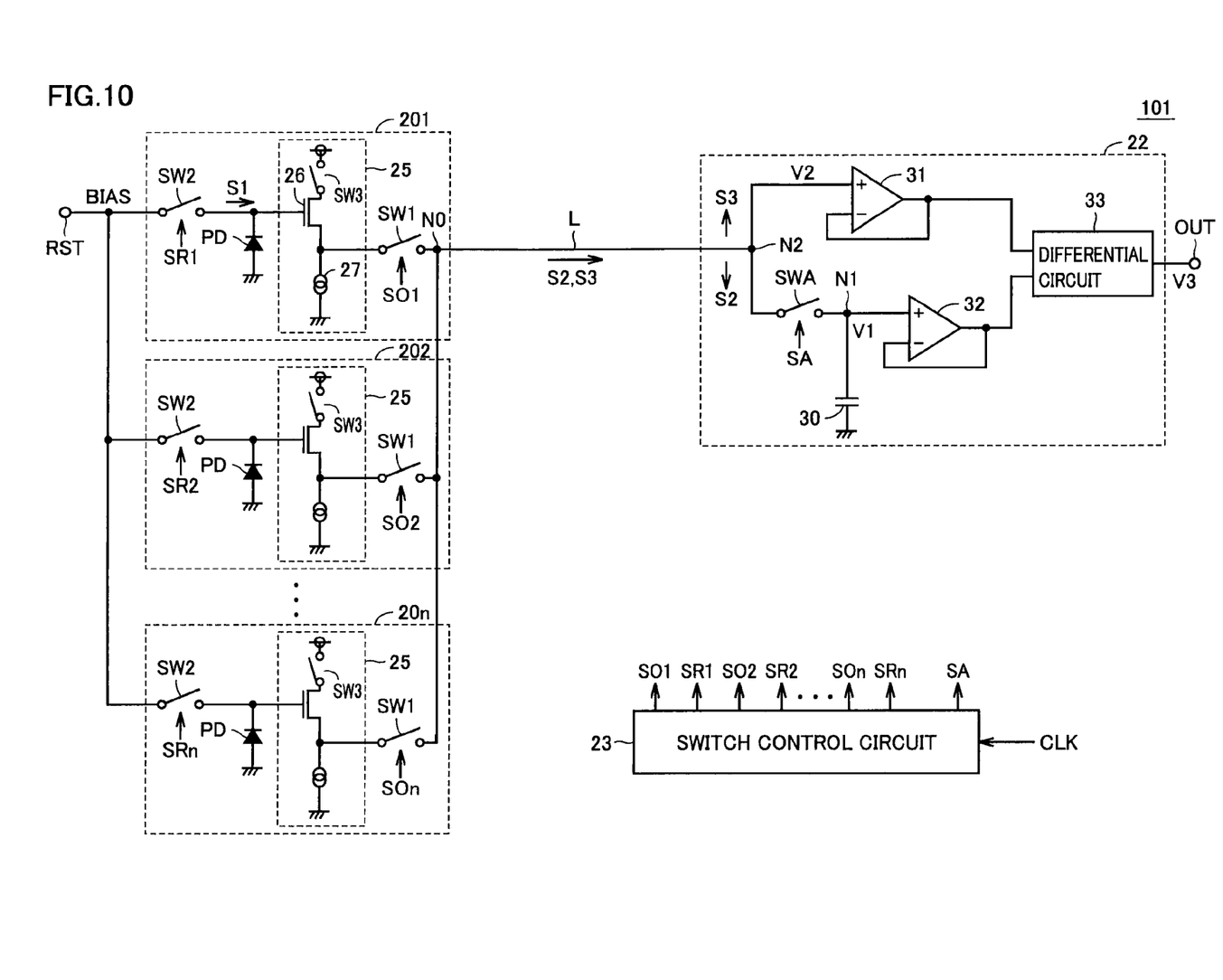
FIG. 10 is a diagram showing an example of the configuration of the image sensor for implementing control of power supply by control unit 3.

Various methods are available for controlling the power supply to the amplifier circuit. For example, as shown in FIG. 10, pixels 201 to 20n are each configured to include a switch SW3 provided between the drain of N-channel MOS transistor 26 and the power supply node. As control unit 3 transmits the signal shown in FIG. 9 to each image sensor (which may be any of image sensor 101 shown in FIG. 3 and image sensor 101A shown in FIG. 7), switch SW3 is turned on and off.

In order to read information of the (n−1)-th row on an image, control unit 3 in FIG. 2 successively selects the first to fifth image sensors. Control unit 3 supplies power to the amplifier circuit of the selected image sensor and stops the power supply to respective amplifier circuits of other image sensors. Then, in order to read information of the n-th row, the control unit again selects the first to fifth sensors successively, and repeats the above-described operation.

Control unit 3 starts supplying power to the image sensor to be selected next, before ending the power supply to the currently selected image sensor. For example, as seen from a comparison of the power supply timing between the fourth image sensor and the fifth image sensor, control unit 3 starts supplying power to the fifth image sensor before ending the power supply to the fourth image sensor.

A certain period of time is necessary to allow amplifier circuit 25 to be operable. Control unit 3 controls the power supply timing so that the fourth image sensor and the fifth image sensor can operate successively. In other words, the present embodiment can operate a plurality of image sensors quickly while preventing the power consumption from increasing.

Switches SW1, SWA and SW2 shown in FIGS. 3 and 7 correspond respectively to the first, second and third switches of the present invention.

In the description above, the correction circuit holds the voltage value of signal S2 in advance, uses the voltage value as held and the voltage value of signal S3 and removes offset voltage α from signal S2. It should be noted that the input voltage to amplifier circuit 25 before signal S1 is input to amplifier circuit 25 is set to voltage BIAS. At this time, if switch SW1 is turned on, a signal corresponding to signal S3 is output from amplifier circuit 25. Thus, the correction circuit may first hold the voltage value of the signal corresponding to signal S3 and use the voltage value and the voltage value of signal S2 to remove offset voltage α from signal S2.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An image sensor, comprising
a plurality of pixels that are selectively activated,
said plurality of pixels each including:
a photoelectric conversion element outputting a first signal according to a received light intensity;
a reset circuit outputting a reference voltage; and
an amplifier circuit amplifying said first signal to output a second signal and outputting a third signal in a case where said amplifier circuit receives said reference voltage instead of said first signal, and
a correction circuit holding a voltage value of one of said second signal and said third signal, using a voltage value of the other of said second signal and said third signal as well as the held voltage value, and removing from said second signal an offset voltage that could be output from said amplifier circuit.

2. The image sensor according to claim 1, further comprising a signal line receiving said second signal and said third signal from said amplifier circuit and transmitting said second signal and said third signal to said correction circuit.

3. The image sensor according to claim 1, wherein
said plurality of pixels each further include a first switch provided between an output terminal of said amplifier circuit and a first node,
said correction circuit includes:
a capacitor having one end with a fixed voltage and the other end receiving said second signal which is input thereto, and holding the voltage value of said second signal;
a second switch provided between said first node and said other end of said capacitor, turned on in a period in which said second signal is input and turned off in a period in which said third signal is input; and
a differential circuit calculating a difference between a voltage value of said first node and a voltage value of said other end of said capacitor.

4. The image sensor according to claim 3, wherein
said correction circuit further includes:
a first output buffer for outputting a voltage held by said capacitor to said differential circuit; and
a second output buffer for outputting a voltage of said first node to said differential circuit.

5. The image sensor according to claim 3, wherein
said reset circuit includes a third switch provided between a reference voltage terminal to which said reference voltage is supplied and a signal output terminal from which said first signal is output by said photoelectric conversion element,
said image sensor further comprises a switch control circuit successively selecting said plurality of pixels based on an input clock signal and controlling said first switch and said third switch included in a selected pixel and controlling said second switch included in said correction circuit, and
said switch control circuit turns on said first switch for one period of said clock signal, turns on and off said second switch in one period of said clock signal, and turns on said third switch in a period in which said second switch is turned off.

6. The image sensor according to claim 5, wherein
said switch control circuit turns on said third switch after said second switch is turned off.

7. The image sensor according to claim 6, wherein
said switch control circuit provides to said second switch a first control signal that changes in synchronization with said clock signal to operate said second switch, and provides to said third switch a second control signal that is a delayed version of said clock signal to operate said third switch.

8. The image sensor according to claim 1, wherein
said plurality of pixels each further include a first switch provided between an output terminal of said amplifier circuit and a first node, and
said correction circuit includes:
a capacitor having one end coupled to said first node;

a constant voltage source outputting a predetermined voltage from a voltage output terminal; and a second switch provided between said voltage output terminal and the other end of said capacitor.

9. The image sensor according to claim 8, wherein said correction circuit further includes an output buffer for outputting a voltage of said other end of said capacitor.

10. The image sensor according to claim 8, wherein said reset circuit includes a third switch provided between a reference voltage terminal to which said reference voltage is supplied and a signal output terminal from which said first signal is output by said photoelectric conversion element, said image sensor further comprises a switch control circuit successively selecting said plurality of pixels based on an input clock signal and controlling said first switch and said third switch included in a selected pixel and controlling said second switch included in said correction circuit, and said switch control circuit turns on said first switch for one period of said clock signal, turns on and off said second switch in one period of said clock signal, and turns on said third switch in a period in which said second switch is turned off.

11. The image sensor according to claim 10, wherein said switch control circuit turns on said third switch after said second switch is turned off.

12. The image sensor according to claim 11, wherein said switch control circuit provides to said second switch a first control signal that changes in synchronization with said clock signal to operate said second switch, and provides to said third switch a second control signal that is a delayed version of said clock signal to operate said third switch.

13. A module, comprising at least one image sensor, said image sensor including a plurality of pixels that are selectively activated, said plurality of pixels each including:

a photoelectric conversion element outputting a first signal according to a received light intensity;

a reset circuit outputting a reference voltage; and an amplifier circuit amplifying said first signal to output a second signal and outputting a third signal in a case where said amplifier circuit receives said reference voltage instead of said first signal, and said image sensor further including a correction circuit holding a voltage value of one of said second signal and said third signal, using a voltage value of the other of said second signal and said third signal as well as the held voltage value, and removing from said second signal an offset voltage that could be output from said amplifier circuit.

14. An electronic device, comprising a module including at least one image sensor, said at least one image sensor including a plurality of pixels that are selectively activated, said plurality of pixels each including:

a photoelectric conversion element outputting a first signal according to a received light intensity;

a reset circuit outputting a reference voltage; and an amplifier circuit amplifying said first signal to output a second signal and outputting a third signal in a case where said amplifier circuit receives said reference voltage instead of said first signal, and said at least one image sensor further including a correction circuit holding a voltage value of one of said second signal and said third signal, using a voltage value of the other of said second signal and said third signal as well as the held voltage value, and removing from said second signal an offset voltage that could be output from said amplifier circuit.

15. The electronic device according to claim 14, wherein said at least one image sensor is a plurality of image sensors, and said electronic device further includes a power supply control circuit successively selecting said plurality of image sensors, supplying power to said amplifier circuit included in a selected image sensor and stopping power supply to said amplifier circuit included at least one other image sensor.

16. The electronic device according to claim 15, wherein said plurality of pixels each further include a switch unit making a switch between a state of supplying power to said amplifier circuit and a state of supplying no power to said amplifier circuit, according to instruction of said power supply control circuit.

* * * * *